(12) United States Patent
Kim et al.

(10) Patent No.: US 8,673,697 B2
(45) Date of Patent: Mar. 18, 2014

(54) THIN FILM TRANSISTOR, METHOD OF FABRICATING THE SAME AND ORGANIC LIGHT EMITTING DIODE DISPLAY DEVICE HAVING THE SAME

(75) Inventors: Moon-Jin Kim, Yongin (KR); Kyoung-Bo Kim, Yongin (KR); Ki-Yong Lee, Yongin (KR); Han-Hee Yoon, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 118 days.

(21) Appl. No.: 13/100,979

(22) Filed: May 4, 2011

(65) Prior Publication Data

US 2011/0207268 A1 Aug. 25, 2011

Related U.S. Application Data

(62) Division of application No. 12/320,110, filed on Jan. 16, 2009, now abandoned.

(30) Foreign Application Priority Data

Jan. 18, 2008 (KR) ........................ 10-2008-0005729

(51) Int. Cl.
*H01L 21/00* (2006.01)
(52) U.S. Cl.
USPC ........... 438/151; 438/139; 438/166; 438/197; 257/628; 257/E21.413
(58) Field of Classification Search
USPC .......... 438/139, 166, 197; 257/628, E21.413, 257/166, 197, 438, 139
See application file for complete search history.

(56) References Cited

U.S. PATENT DOCUMENTS

| | | | |
|---|---|---|---|
| 5,466,641 | A | 11/1995 | Shimizu et al. |
| 5,548,132 | A | 8/1996 | Batra et al. |
| 5,565,691 | A | 10/1996 | Arai et al. |
| 5,771,110 | A | 6/1998 | Hirano et al. |
| 6,150,203 | A | 11/2000 | Yamazaki et al. |

(Continued)

FOREIGN PATENT DOCUMENTS

| | | |
|---|---|---|
| JP | 2000-138378 | 5/2000 |
| JP | 3323838 | 6/2002 |

(Continued)

OTHER PUBLICATIONS

Office action issued by USPTO on May 27, 2009 in Applicant's cross-reference U.S. Appl. No. 11/951,525.

(Continued)

*Primary Examiner* — Mark A Laurenzi
(74) *Attorney, Agent, or Firm* — Robert E. Bushnell, Esq.

(57) ABSTRACT

A method of fabricating a thin film transistor, comprising steps of preparing a substrate; forming a polycrystalline silicon layer on the substrate; injecting impurities into the polycrystalline silicon layer for channel doping; patterning the polycrystalline silicon layer and forming a semiconductor layer; annealing the semiconductor layer in an $H_2O$ atmosphere, and forming a thermal oxide layer on the semiconductor layer; forming a silicon nitride layer on the thermal oxide layer; forming a gate electrode at a location corresponding to a predetermined region of the semiconductor layer; forming an interlayer insulating layer on the entire surface of the substrate; and forming source and drain electrodes electrically connected with the semiconductor layer.

9 Claims, 3 Drawing Sheets

(56) References Cited

U.S. PATENT DOCUMENTS

| | | |
|---|---|---|
| 2001/0002703 A1 | 6/2001 | Koyama .................. 257/40 |
| 2002/0113264 A1 | 8/2002 | Horikoshi et al. |
| 2004/0108576 A1* | 6/2004 | Yamazaki et al. ......... 257/628 |
| 2005/0046342 A1 | 3/2005 | Park et al. |
| 2005/0214996 A1 | 9/2005 | Yoshino |
| 2005/0258486 A1* | 11/2005 | Yoon ........................ 257/347 |
| 2006/0003501 A1* | 1/2006 | Kakkad et al. ............ 438/149 |
| 2006/0051903 A1 | 3/2006 | Kunii |
| 2006/0051914 A1* | 3/2006 | Kakehata et al. ......... 438/197 |
| 2007/0117284 A1 | 5/2007 | Imai et al. |
| 2007/0126478 A1* | 6/2007 | Kapoor ...................... 326/82 |
| 2007/0278932 A1* | 12/2007 | Koyama et al. ........... 313/498 |
| 2008/0135838 A1 | 6/2008 | Park et al. |
| 2008/0135893 A1 | 6/2008 | Park et al. |

FOREIGN PATENT DOCUMENTS

| | | |
|---|---|---|
| JP | 2003-008023 | 1/2003 |
| JP | 2003-197632 | 7/2003 |
| JP | 2005-311303 | 11/2005 |
| JP | 2006-049535 | 2/2006 |
| KR | 10-1994-0025035 | 11/1994 |
| KR | 10-1995-0002071 | 1/1995 |
| KR | 10-0191091 | 1/1999 |
| KR | 10-2004-0050768 | 6/2004 |
| KR | 10-2004-0064810 | 7/2004 |
| KR | 10-2005-0110345 | 11/2005 |
| KR | 10-2006-0001706 | 1/2006 |
| KR | 10-2006-0003242 | 1/2006 |
| KR | 10-2006-008634 | 1/2006 |
| KR | 10-2006-0015195 | 2/2006 |
| WO | WO 97/47046 | 12/1997 |
| WO | 2006/031017 | 3/2006 |

OTHER PUBLICATIONS

Office action issued by USPTO on Jan. 12, 2010 in Applicant's cross-reference U.S. Appl. No. 11/951,525.

Korean Office action issued on Apr. 8, 2010 in the Applicant's corresponding Korean Patent Application No. 10-2008-0005729.

Office action issued by USPTO on Feb. 3, 2009 in Applicant's cross-reference U.S. Appl. No. 11/951,525.

* cited by examiner

THIN FILM TRANSISTOR, METHOD OF FABRICATING THE SAME AND ORGANIC LIGHT EMITTING DIODE DISPLAY DEVICE HAVING THE SAME

CROSS-REFERENCE TO RELATED APPLICATIONS AND CLAIM OF PRIORITY

This application is a divisional of applicant's Ser. No. 12/320,110 entitled Thin Film Transistor, Method of Fabricating the Same and Organic Light Emitting Diode Display Device Having the Same filed in the U.S. Patent & Trademark Office on 16 Jan. 2009, and assigned to the assignee of the above-captioned application. Furthermore, this application makes reference to, incorporates the same herein, and claims all benefits accruing under 35 U.S.C. §119, §120 and §121 from the aforesaid applicants' Ser. No. 12/320,110 and from an application earlier filed in the Korean Intellectual Property Office on the 18of Jan. 2008 and there duly assigned Serial No. 10-2008-0005729.

BACKGROUND OF THE INVENTION

1. Field of the Invention

The present invention relates to a thin film transistor, a method of fabricating the same and an organic light emitting diode (OLED) display device having the same.

2. Description of the Related Art

Generally, a polycrystalline thin film transistor used in a display device is fabricated by depositing amorphous silicon on a transparent substrate formed of glass or quartz, dehydrogenating the amorphous silicon, and crystallizing the amorphous silicon to form a semiconductor layer. After that, a gate insulating layer and a gate electrode are formed on the semiconductor layer, an impurity is injected into the semiconductor layer to form source and drain regions, and an interlayer insulating layer and source and drain electrodes are formed, so that the thin film transistor is completed.

Alternatively, to improve electrical characteristics of a thin film transistor, channel doping may be further performed. To be more specific, after injecting a predetermined impurity into a semiconductor layer, ion-injection for improving electrical characteristics of a region to be a channel, i.e., channel doping is performed, and then a gate insulating layer and a gate electrode are formed on the semiconductor layer.

However, in a common process of fabricating the thin film transistor, an annealing process for activating impurity ions injected into the semiconductor layer has to be performed after the channel doping. Therefore, the process becomes complicated and production yield is lowered.

A gate insulating layer insulating the semiconductor layer is generally formed of silicon oxide or silicon nitride by chemical vapor deposition (CVD). However, the layer deposited by CVD has poor quality and uniformity, so that the layer has to be deposited to a thickness of 1000 Å (angstroms) or more.

Examples of thin film transistors are found in commonly assigned co-pending patent application Ser. No. 11/987,951 filed 6 Dec. 2007 and published on 12 Jun. 2008 having Publication No. 2008/0135893 entitled "Thin Film Transistor, Method of Fabricating the Same, and Display Device Including the Same" to Hye-Hyang Park et al., and commonly assigned co-pending patent application Ser. No. 11/951,525 filed 6 Dec. 2007 and published on 12 Jun. 2008 having Publication No. 2008/0135838 entitled "Thin Film Transistor, Method of Fabricating the Same, and Organic Light Emitting Diode Display Device Including the Same" to Hye-Hyang Park.

For this reason, the electrical characteristics of the thin film transistor are difficult to be controlled, and overall characteristics of the thin film transistor become degraded.

SUMMARY OF THE INVENTION

An aspect of the present invention provides a thin film transistor which is formed in a simpler process and has better electrical characteristics than a conventional art, and a method of fabricating the same.

Another aspect of the present invention provides an organic light emitting diode (OLED) display device having the thin film transistor.

According to an embodiment of the present invention, a thin film transistor includes: a substrate; a semiconductor layer disposed on the substrate and including a channel region, and source and drain regions, the channel region being doped with impurities; a thermal oxide layer disposed on the semiconductor layer; a silicon nitride layer disposed on the thermal oxide layer; a gate electrode disposed on the silicon nitride layer and corresponding to a predetermined region of the semiconductor layer; an interlayer insulating layer disposed on the entire surface of the substrate; and source and drain electrodes electrically connected with the semiconductor layer.

According to another embodiment of the present invention, a method of fabricating a thin film transistor includes: preparing a substrate; forming a polycrystalline silicon layer on the substrate; injecting impurities into the polycrystalline silicon layer for channel doping; patterning the polycrystalline silicon layer and forming a semiconductor layer; annealing the semiconductor layer in an $H_2O$ atmosphere, and forming a thermal oxide layer on the semiconductor layer; forming a silicon nitride layer on the thermal oxide layer; forming a gate electrode at a location corresponding to a predetermined region of the semiconductor layer; forming an interlayer insulating layer on the entire surface of the substrate; and forming source and drain electrodes electrically connected with the semiconductor layer.

According to still another embodiment of the present invention, an organic light emitting diode (OLED) display device includes: a substrate; a semiconductor layer disposed on the substrate, and including a channel region and source and drain regions, the channel region being doped with impurities; a thermal oxide layer disposed on the semiconductor layer; a silicon nitride layer disposed on the thermal oxide layer; a gate electrode disposed on the silicon nitride layer and corresponding to a predetermined region of the semiconductor layer; an interlayer insulating layer disposed on the entire surface of the substrate; source and drain electrodes electrically connected with the semiconductor layer; a first electrode electrically connected with one of the source and drain electrodes; an organic layer disposed on the first electrode; and a second electrode disposed on the organic layer.

Additional aspects and/or advantages of the invention will be set forth in part in the description which follows and, in part, will be obvious from the description, or may be learned by practice of the invention.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicated the same or similar components, wherein.

DETAILED DESCRIPTION OF THE INVENTION

Figure 1A:
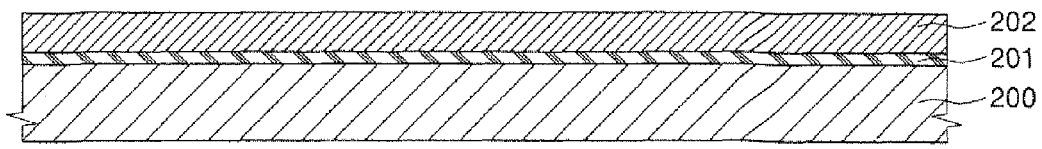
FIGS. 1A to 1G are cross-sectional views illustrating a process of fabricating a thin film transistor according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIGS. 1A to 1G are cross-sectional views illustrating a process of fabricating a thin film transistor according to an exemplary embodiment of the present invention.

Referring to FIG. 1A, a buffer layer 201 may be formed on a substrate 200, for example, formed of insulating glass or plastic. The buffer layer 201 prevents diffusion of moisture or impurities from the substrate or controls a heat transfer rate during crystallization, so as to facilitate the crystallization of a polycrystalline silicon layer to be formed in a following process. The buffer layer 201 may be fowled of silicon oxide, silicon nitride or a combination thereof.

Subsequently, an amorphous silicon layer 202 is formed on the buffer layer 201. Here, the amorphous silicon layer may be deposited by plasma enhanced chemical vapor deposition (PECVD) or low pressure chemical vapor deposition (LPCVD). Here, PECVD is performed using $SiH_4$+Ar and/or $H_2$ at a temperature ranging from 330 to 430° C. and a pressure ranging from 1 to 1.5 Ton. LPCVD is performed using $Si_2H_6$+Ar at a temperature ranging from 400 to 500° C. and a pressure ranging from 0.2 to 0.4 Torr.

Figure 1B:
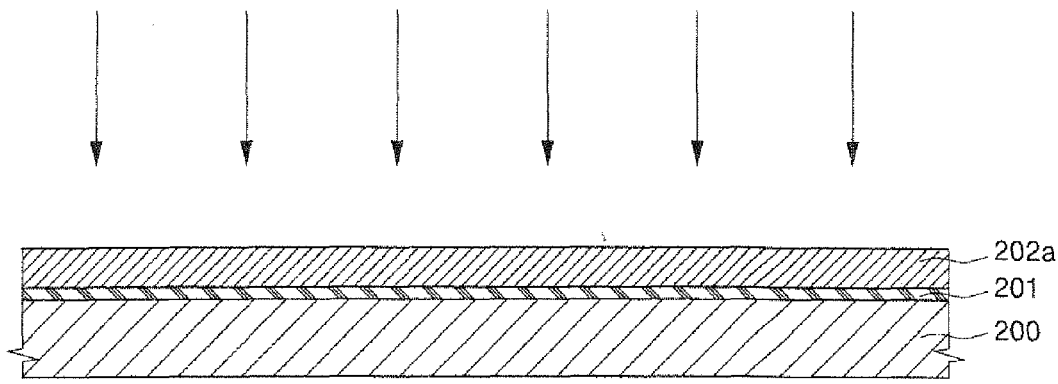

After that, as illustrated in FIG. 1B, the amorphous silicon layer 202 is crystallized, thereby forming a polycrystalline silicon layer 202a. Here, the polycrystalline silicon layer 202a may be formed by one selected from the group consisting of solid phase crystallization (SPC), sequential lateral solidification (SLS), excimer laser annealing (ELA), metal induced crystallization (MIC), metal induced lateral crystallization (MILC), and super grain silicon crystallization (SGS).

Subsequently, impurities, e.g., boron (B) or phosphorous (P) ions, are injected at a dose of $0.5 \times 10^{12}/cm^2$ to $1.5 \times 10^{12}/cm^2$ into the entire surface of the substrate 200 having the polycrystalline silicon layer 202a for channel doping. Here, the channel doping is to form a channel region of a thin film transistor having a predetermined resistance. Thus, device's characteristics such as threshold voltage and drain current of the thin film transistor can be controlled by the doped ions.

Figure 1C:
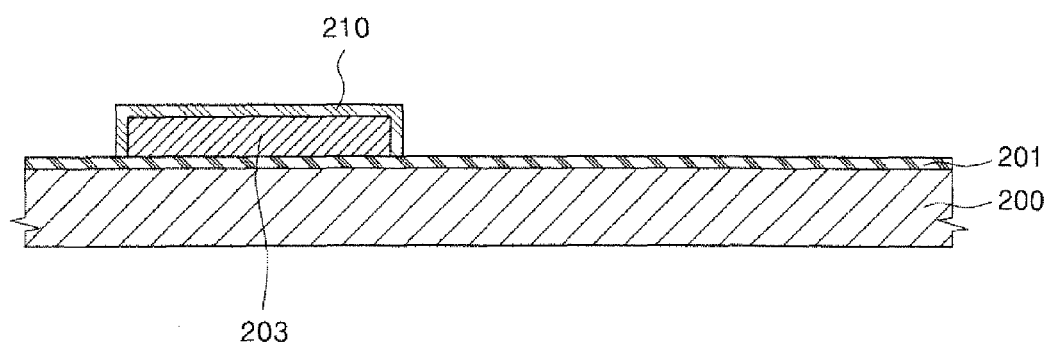

Subsequently, referring to FIG. 1C, the polycrystalline silicon layer 202a formed on the substrate 200 is patterned, thereby forming a semiconductor layer 203. Then, a thermal oxide layer 210 is formed by annealing the semiconductor layer 203 formed of the polycrystalline silicon in an H2O atmosphere.

In the present invention, the annealing process uses a common high-temperature annealing technique such as a rapid thermal annealing or furnace technique in an $H_2O$ atmosphere, but in the conventional art, the annealing process was performed in an $N_2$ or $O_2$ atmosphere.

Here, the annealing process performed in an $H_2O$ atmosphere further reduces annealing time at the same temperature, or reduces annealing temperature at the same annealing time as that performed in an $N_2$ or $O_2$ atmosphere.

Particularly, while a conventional transparent insulating substrate formed of glass is bent at high temperature, the present invention can reduce the annealing temperature as described above, and thus can prevent the bending of the substrate.

In the present invention, the annealing temperature may range from 400 to 550° C. Here, the annealing temperature is preferably 400° C. or more, because the amorphous silicon is crystallized at an appropriate temperature, and the annealing temperature is preferably 550° C. or less, because the substrate is deformed at high temperature.

In addition, a pressure of $H_2O$ may be in a range from 10000 Pa to 2 MPa. Here, the pressure of $H_2O$ is preferably 10000 Pa or more, in consideration that the annealing time is determined by a crystallization rate of amorphous silicon, which is proportional to a pressure. Further, the pressure of $H_2O$ is preferably 2 MPa or less, in consideration that a device can be exploded at high pressure.

Here, when the semiconductor layer 203 is annealed in the $H_2O$ atmosphere, a thermal oxide layer 210 is formed on the entire surface of the semiconductor layer 203 by thermal oxidation.

Here, the thermal oxide layer 210 may be formed to a thickness of 50 to 300 angstroms. That is, the thickness of the thermal oxide layer 210 is preferably 50 angstroms or more, in consideration that the thermal oxide layer 210 serves as a gate insulating layer, and the thickness of the thermal oxide layer 210 is preferably 300 angstroms or less, in consideration of a processing time of the thermal oxide layer 210. Also, the thickness of the thermal oxide layer 210 may be controlled by the annealing temperature and time.

By the annealing process described above, the channel-doped impurity ions are simultaneously activated, and thus the process can be simpler than the conventional art in which a separate annealing process was performed.

Figure 1D:
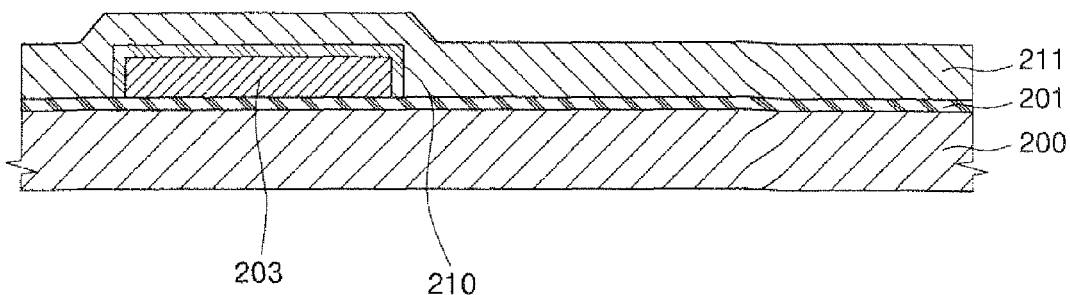

Subsequently, referring to FIG. 1D, a silicon nitride layer 211 is for tried on the entire surface of the substrate 200 having the thermal oxide layer 210 by CVD. Both the thermal oxide layer 210 and the silicon nitride layer 211 serve as a gate insulating layer. In the present invention, a gate insulating layer is formed of a combination of the thermal oxide layer 210 and the silicon nitride layer 211.

When a gate insulating layer is formed of silicon oxide by CVD like the conventional art, it is formed to a thickness of 1000 angstroms or more to prevent deterioration of quality and uniformity of the layer. However, in the present invention, the thermal oxide layer 210 used as the gate insulating layer is for toed to a thickness of 300 angstroms or less, and thus the characteristics of the thin film transistor can be easily controlled. Further, due to the thermal oxide layer 210 used as the gate insulating layer, the characteristics of the thin film transistor can be improved.

Figure 1E:
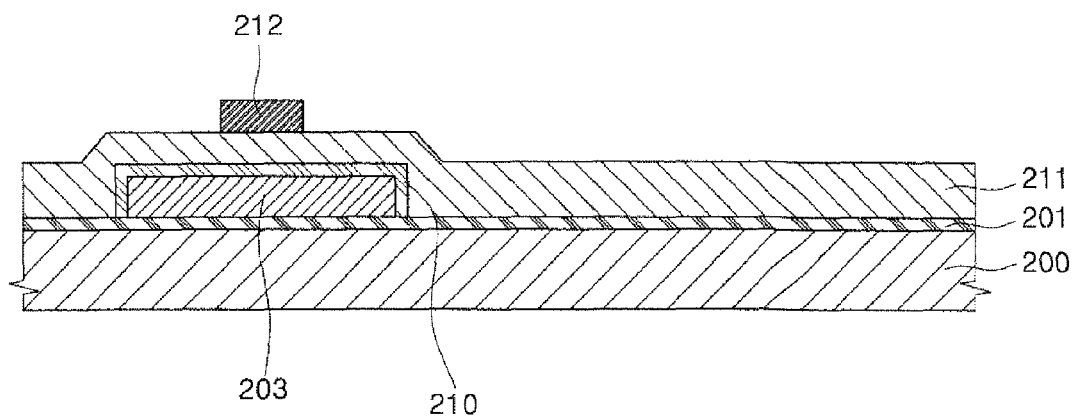

Subsequently, referring to FIG. 1E, a metal layer for a gate electrode is formed of a single layer of aluminum (Al) or an aluminum alloy such as aluminum-neodymium (Al—Nd), or a multi layer in which Al or an Al alloy is disposed on chromium (Cr), molybdenum (Mo) or an alloy thereof, on the entire surface of the substrate 200. Then, the metal layer for a gate electrode is etched, thereby forming a gate electrode 212 in a predetermined region corresponding to the semiconductor layer 203.

Figure 1F:
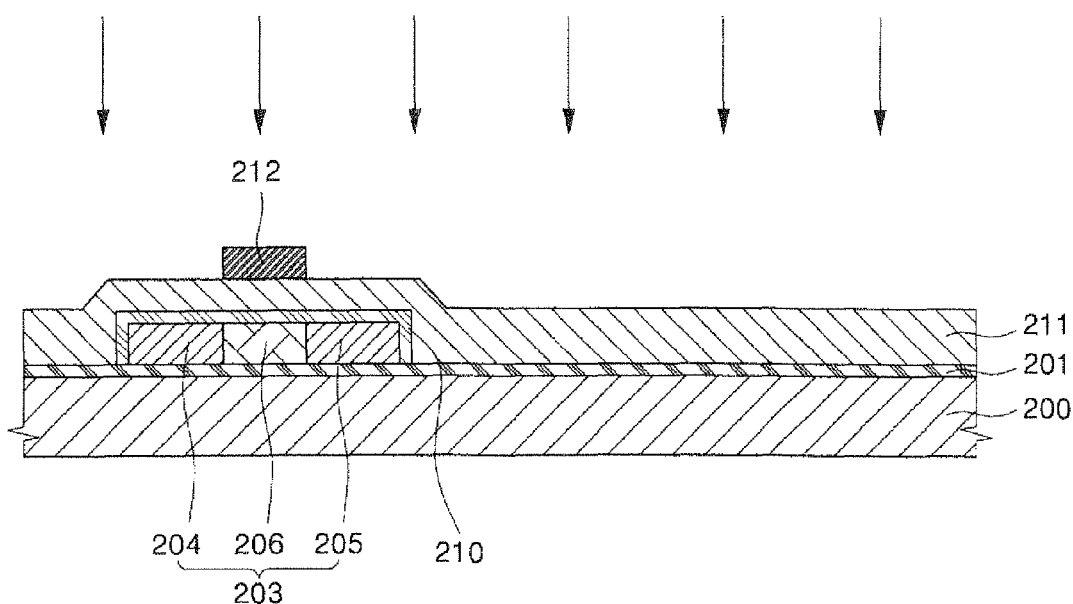

Referring to FIG. 1F, conductive impurity ions are injected at a predetermined dose using the gate electrode 212 as a mask, so that source and drain regions 204 and 205 and a channel region 206 are formed. To form a thin film transistor, a p-type or n-type impurity can be used. Here, the p-type impurity may be one selected from the group consisting of B, Al, gallium (Ga) and indium (In), and the n-type impurity may be one selected from the group consisting of P, arsenic (As) and antimony (Sb).

Figure 1G:
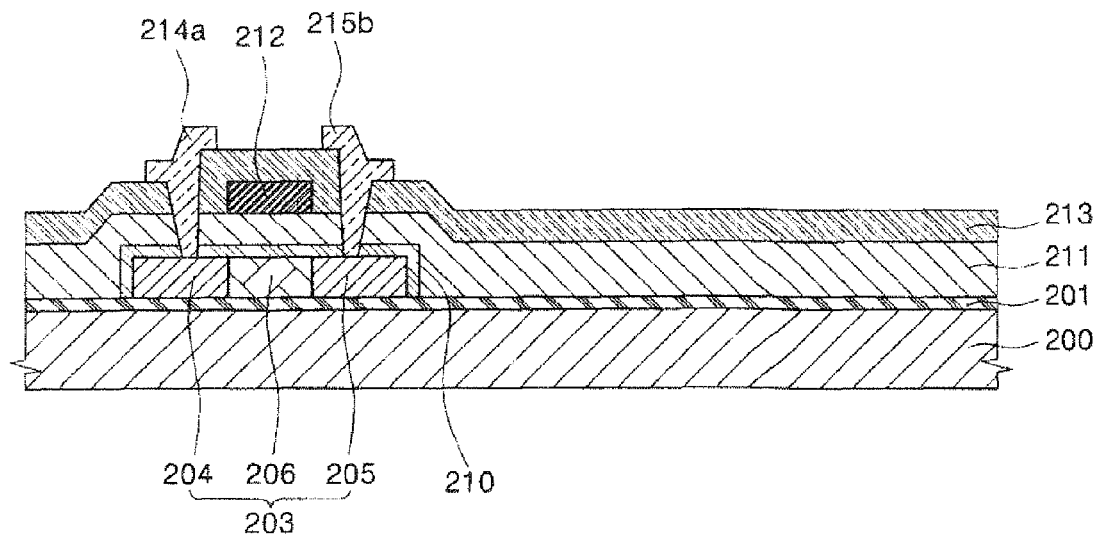

Referring to FIG. 1G, an interlayer insulating layer 213 is formed on the entire surface of the substrate 200 having the gate electrode 212.

Subsequently, predetermined regions of the interlayer insulating layer 213, the silicon nitride layer 211 and the thermal oxide layer 210 are etched, thereby forming contact holes. Source and drain electrodes 214 and 215 are then formed electrically connected with the source and drain regions 204 and 205 of the semiconductor layer 203 through the contact holes. Thus, the thin film transistor according to the exemplary embodiment of the present invention is completed.

As described above, the thin film transistor of the present invention can be manufactured in a simpler process because the channel-doped impurity ions are simultaneously activated by the annealing process during the formation of the thermal oxide layer, and can have improved characteristics because the thermal oxide layer is used as the gate insulating layer.

Hereinafter, an experimental example will be described to help comprehension of the present invention. However, the experimental example is provided only to comprehend the present invention, which will not be limited thereto.

EXPERIMENTAL EXAMPLE

A semiconductor layer (W/L=10/10 μm) formed of polycrystalline silicon was formed on a substrate, and channel doping was performed by injecting BH3 ions into the semiconductor layer at a concentration of $1.2 \times 10^{12}/cm^2$ and an accelerating voltage of 17 KeV. Then, the substrate having the semiconductor layer was annealed for 60 minutes at 2 MPa and 550° C. in an $H_2O$ atmosphere to activate the channel-doped ions and form a thermal oxide ($SiO_2$) layer having a thickness of 160 Å. After that, a silicon nitride layer was followed to a thickness of 200 angstroms on the entire surface of the substrate by CVD, and a gate electrode was formed to a thickness of 3000 angstroms by depositing molybdenum (Mo). Source and drain regions were formed by injecting BH3 ions into the entire surface of the substrate at a concentration of $1.0 \times 10^{15}/cm^2$ and an accelerating voltage of 40 KeV, and an interlayer insulting layer was formed to a thickness of 400 angstroms by CVD. Then, source and drain electrodes were formed to a thickness of 4000 angstroms by depositing Mo to be connected with the source and drain regions of the semiconductor layer, and thus a thin film transistor was completed.

Threshold voltage, charge mobility and leakage current of the thin film transistor fabricated according to the above experimental example were measured, and the results are listed in Table 1.

TABLE 1

| Threshold voltage (v) | Charge mobility ($cm^2/Vs$) | Leakage current (A/m) |
|---|---|---|
| −3.93 | 27.38 | $2.58E^{-13}$ |

Figure 1H:
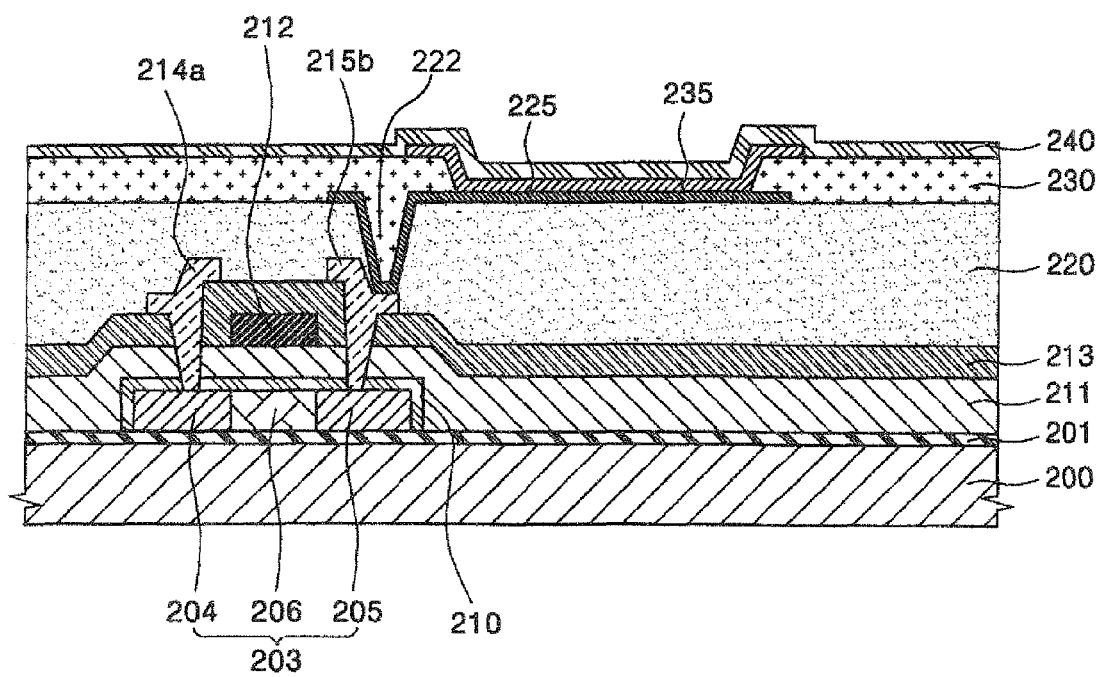
FIG. 1H is a cross-sectional view of an organic light emitting diode (OLED) display device according to an exemplary embodiment of the present invention.

Subsequently, FIG. 1H is a cross-sectional view of an organic light emitting diode (OLED) display device according to an exemplary embodiment of the present invention.

Referring to FIG. 1H, a planarization layer 220 is formed on the entire surface of the substrate 200. The planarization layer 220 may be formed of an organic layer, an inorganic layer or a combination thereof. The inorganic planarization layer 220 may be formed of spin on glass (SOG), and the organic planarization layer 220 may be formed of acrylic resin, polyimide resin or benzocyclobutene (BCB).

Here, the planarization layer 220 is etched, thereby following a via hole 222 exposing one of the source and drain electrodes 214 and 215, and forming a first electrode 225 connected with one of the source and drain electrodes 214 and 215. The first electrode 225 is disposed on a bottom of the via hole 222 to be in contact with the exposed one of the source and drain electrodes 214 and 215, and extends onto the planarization layer 220. The first electrode 225 may be formed of indium tin oxide (ITO) or indium zinc oxide (IZO).

Subsequently, a pixel defining layer 230 is formed on the entire surface of the substrate 200 having the first electrode 225, and has a sufficient thickness to completely fill the via hole 222 in which the first electrode 225 is disposed. The pixel defining layer 230 may be formed of an organic or inorganic layer, and preferably an organic layer. More preferably, the pixel defining layer 230 is formed of one selected from the group consisting of BCB, acrylic resin and polyimide. The pixel defining layer 230 can be uniformly formed on the entire surface of the substrate because of good flowability.

Here, the pixel defining layer 230 is etched, thereby forming an opening exposing the first electrode 225, and an organic layer 235 is formed on the first electrode 225 exposed through the opening. The organic layer 235 includes at least an light emitting layer, and may further include at least one of a hole injection layer, a hole transport layer, an electron transport layer and an electron injection layer.

Subsequently, a second electrode 240 is formed on the entire surface of the substrate 200. The second electrode 240 may be a transmissive electrode, which is transparent and may be formed of Mg, Ag, Al, Ca or an alloy thereof having a low work function.

Thus, the OLED display device according to the exemplary embodiment of the present invention is completed.

According to the present invention, a thin film transistor having improved electrical characteristics can be fabricated in a simpler fabrication process than a conventional art.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of fabricating a thin film transistor, comprising:
   preparing a substrate;
   forming a polycrystalline silicon layer on the substrate;
   injecting impurities into the polycrystalline silicon layer for channel doping;
   patterning the polycrystalline silicon layer and forming a semiconductor layer prior to annealing the semiconductor layer;
   annealing the semiconductor layer in an $H_2O$ atmosphere, and forming a thermal oxide layer on the semiconductor layer;
   forming a silicon nitride layer on the thermal oxide layer;

forming a gate electrode at a location corresponding to a predetermined region of the semiconductor layer;

forming an interlayer insulating layer on the entire surface of the substrate; and forming source and drain electrodes electrically connected with the semiconductor layer.

2. The method according to claim 1, wherein the annealing is performed by rapid thermal annealing (RTA).

3. The method according to claim 1, wherein the annealing is performed at a temperature ranging from 400° C. to 550° C.

4. The method according to claim 1, wherein the annealing in the $H_2O$ atmosphere is performed at a pressure ranging from 10000 Pa to 2 MPa.

5. The method according to claim 1, wherein the source and drain regions are formed by injecting impurities into the semiconductor layer after forming the gate electrode.

6. The method according to claim 1, wherein the channel doping is performed by injecting boron (B) or phosphorous (p) impurities.

7. The method according to claim 1, wherein the channel doping is performed by injecting impurities at a dose ranging from $0.5 \times 10^{12}/cm^2$ to $1.5 \times 10^{12}/cm_2$.

8. The method according to claim 1, wherein the thermal oxide layer is formed to a thickness of 50 Å to 300 Å.

9. The method according to claim 1, wherein the thermal oxide layer is formed of silicon oxide.

* * * * *